(12) United States Patent
Shah et al.

(10) Patent No.: US 8,212,230 B2
(45) Date of Patent: Jul. 3, 2012

(54) INTEGRATED CIRCUITS WITH PHASE CHANGE DEVICES

(75) Inventors: Amip Shah, Santa Clara, CA (US); Chandrakant Patel, Fremont, CA (US); Ratnesh Sharma, Fremont, CA (US); Cullen Bash, Los Gatos, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 0 days.

(21) Appl. No.: 13/244,514

(22) Filed: Sep. 25, 2011

(65) Prior Publication Data
US 2012/0020150 A1 Jan. 26, 2012

Related U.S. Application Data

(62) Division of application No. 12/254,607, filed on Oct. 20, 2008, now Pat. No. 8,053,748.

(60) Provisional application No. 61/016,127, filed on Dec. 21, 2007.

(51) Int. Cl.
*G11C 11/00* (2006.01)
(52) U.S. Cl. ............................ 257/2; 365/163; 365/148
(58) Field of Classification Search .............. 257/2, 258; 365/205, 100; 438/282
See application file for complete search history.

*Primary Examiner* — Jarrett Stark
*Assistant Examiner* — Lawrence Tynes, Jr.

(57) ABSTRACT

Embodiments include methods, apparatus, and systems with integrated circuits having phase change devices. One embodiment includes an integrated circuit die and a phase change die having a phase change material that changes phases when a temperature at the integrated circuit die exceeds a threshold for a predetermined amount of time.

7 Claims, 4 Drawing Sheets

INTEGRATED CIRCUITS WITH PHASE CHANGE DEVICES

CROSS-REFERENCE TO RELATED APPLICATION

This application is a divisional of non-provisional application Ser. No. 12/254,607, filed Oct. 20, 2008 now U.S. Pat. No. 8,053,748, which claims priority from provisional application Ser. No. 61/016,127, filed Dec. 21, 2007, the contents of which are incorporated herein by reference in theft entirety.

BACKGROUND

Varying workloads on microprocessors or memory chips leads to non-uniform thermal loading or temperature cycling due to heat dissipation of the power supplied to the chip. It is difficult to predict when a chip will fail during its lifetime since the chip experiences such variations in temperature.

Heat across a surface or area of a microprocessor or memory chip is also distributed in a non-uniform manner. Some areas on the chip are actually at higher temperatures than other areas. Varying temperature gradients makes it difficult to know exactly which area of the chip requires maximum cooling.

System downtime due to unanticipated thermal spikes or long-term thermal fluctuation can affect both performance and life expectancy of processors, chips, and electronic devices. For example, if the device operates at an elevated temperature, performance decreases while the risk of failure increases.

Accurately tracking temperature variations across a microprocessor or memory chip would not only enhance overall performance of the device but also increase life expectancy.

DETAILED DESCRIPTION

Embodiments are directed to apparatus, systems, and methods to manage chip-scale packages using phase change devices. One embodiment is an in-situ system to detect approaching failure of a chip-scale package (including a microprocessor or memory) based on lifetime thermal characteristics of the device. A phase-change die (such as a chalcogenide based memory device) mounts into or upon the chip-scale package. Exposure to high temperature for sufficient period of time changes an electrical resistance of the phase-change material. This change of resistance is then used as a signal to an on-board or external controller. The signal indicates that the chip-scale package is approaching thermal failure. The controller can then accordingly respond to prevent service disruption, failure, or damage to the device.

One exemplary embodiment monitors an integrated circuit (IC) chip or die during its lifetime to determine when the chip or die is likely to fail. In one embodiment, phase change material is applied to a surface of the chip or die. The phase change material changes phases (for example, from an amorphous state to a crystalline state) upon the occurrence of a temperature based event, such as exceeding a threshold temperature for a predetermined period of time. For example, if the phase material experiences a high temperature for a short period of time or a lower temperature for a longer period of time, then the phase property of the material changes. This phase change causes a change in electrical resistance across the chip or die. The change in electrical resistance is detected and a corrective measure or action is taken to decrease the temperature of the chip or die before damage or failure occurs at the chip or die.

By way of illustration, after a phase change is detected, a notification is sent to a user or controller. The notification indicates that the temperature threshold has been exceeded. For example, the phase change material changes phases when a microprocessor is beginning to become too hot.

Upon receipt of the notification signal, one or more corrective actions are taken. By way of example, such actions can be automated and include increase cooling to the device, decrease processing to decrease the power consumption and/or temperature, shift workload from the device to another device, turn-off the device, replace a component on the device, etc. By way of illustration, one embodiment could decrease processing by relocating the power distribution across the die but not actually reducing the overall power consumption (this process would still reduce peak temperature).

Exemplary embodiments are also used to increase efficiency of the device or system using the device. For example, devices operating above a threshold temperature are less efficient. Reducing the temperature at such devices can increase efficiency. Further, the device and system are more reliable over a longer life expectancy.

Figure 1:
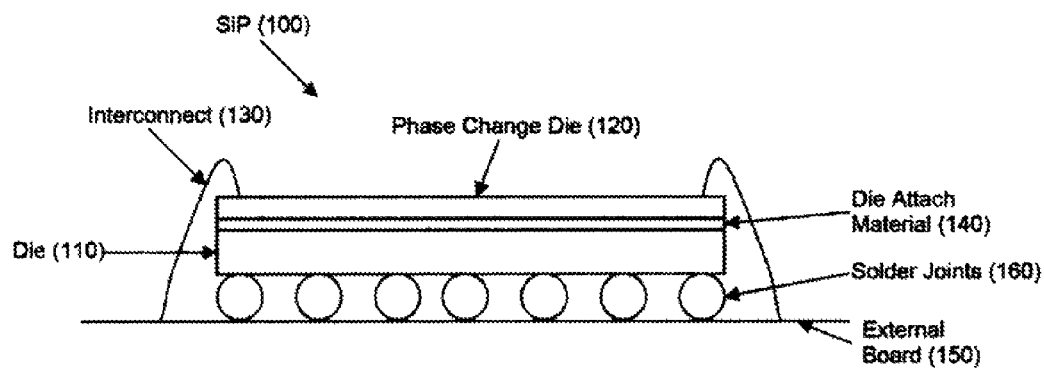
FIG. 1 is a diagram of an integrated circuit die with a phase change die in accordance with an exemplary embodiment.

FIG. 1 is a diagram of an integrated circuit die with a phase change die in accordance with an exemplary embodiment. For illustration, a system-in-package (SiP) 100 in shown and includes three main components of an IC die 110, a phase change die 120, and an interconnect 130. The phase change die 120 is stacked on or vertically positioned adjacent to the die 110. A die attach material 140 is located between the phase change die 120 and die 110 and serves to bond or adhere these elements together. The die mechanically and/or electrically couples to a printed circuit board (PCB) 150, such as a motherboard or backplane, using plural solder joints 160.

Exemplary embodiments monitor the temperature of the IC die 110 during its lifetime. The IC die can include various heat generating devices such as, but not limited to, a microprocessor in a computer system, a flash memory in a mobile device, and/or one or more other heat generating components.

The phase change die 120 has an electrical resistivity that is a function of temperature. By way of example, the die includes a chalcogenide based memory die. This die contains a layer of phase change material, such as a GST (Ge—Sb—Te) alloy. The layer of phase change material provides the desired sensitivity to temperature.

The interconnect 130 electrically couples the phase change die 120 to the PCB 150 and enables communication into and out of the phase change die. These interconnects can be wires, through-hole vias, solder balls, or some other type of electrical coupling mechanism.

Figure 2:
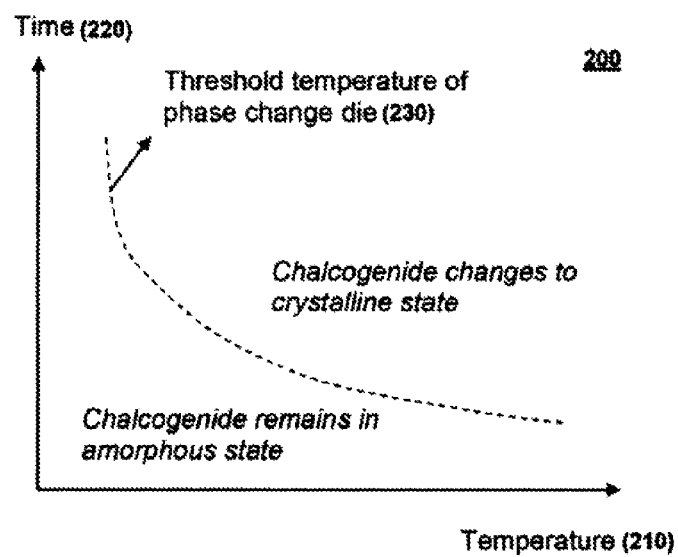
FIG. 2 is a graph of temperature sensitivity of a phase change die in accordance with an exemplary embodiment.

Depending on the thermal history to which the material has been exposed, the phase change material can reside in either an amorphous or crystalline state. For example, FIG. 2 shows the temperature sensitivity of an exemplary phase change die. Assuming the die is in the amorphous state initially, this state is maintained until a threshold temperature-time combination is met. Upon reaching this thermal exposure, the phase change material will change to crystalline state.

Specifically, FIG. 2 shows a graph 200 of a time versus temperature curve of a chalcogenide-based memory device. The graph has an x-axis of temperature 210, and a y-axis of time 220. A curve 230 shows the threshold temperature of the phase change die. Notice that the threshold is dependent on both temperature and time. When the temperature and time are below thresholds, the material remains in an amorphous state. By contrast, when the temperature and time are above the thresholds, the material transitions to the crystalline state. If the device is exposed to high temperatures for a short period of time, to low temperatures for a long period of time or to high temperature for a longer period of time, then the material changes from amorphous to crystalline state.

To reset the phase of the material, the temperature is raised to the melting point of the material (for example, nominally 450-600 degrees Celsius for chalcogenide) and then rapidly quenched to freeze the state. This resetting can be achieved, for example, through electrical heating of a localized area of the chalcogenide that is insulated from the surrounding material. For example, in a phase change memory die, it is possible to reset one bit without changing the state of the surrounding bits. Other resetting techniques are also within exemplary embodiments (for example, thermally resetting the chalcogenide using pulsed laser heating).

Figure 3:
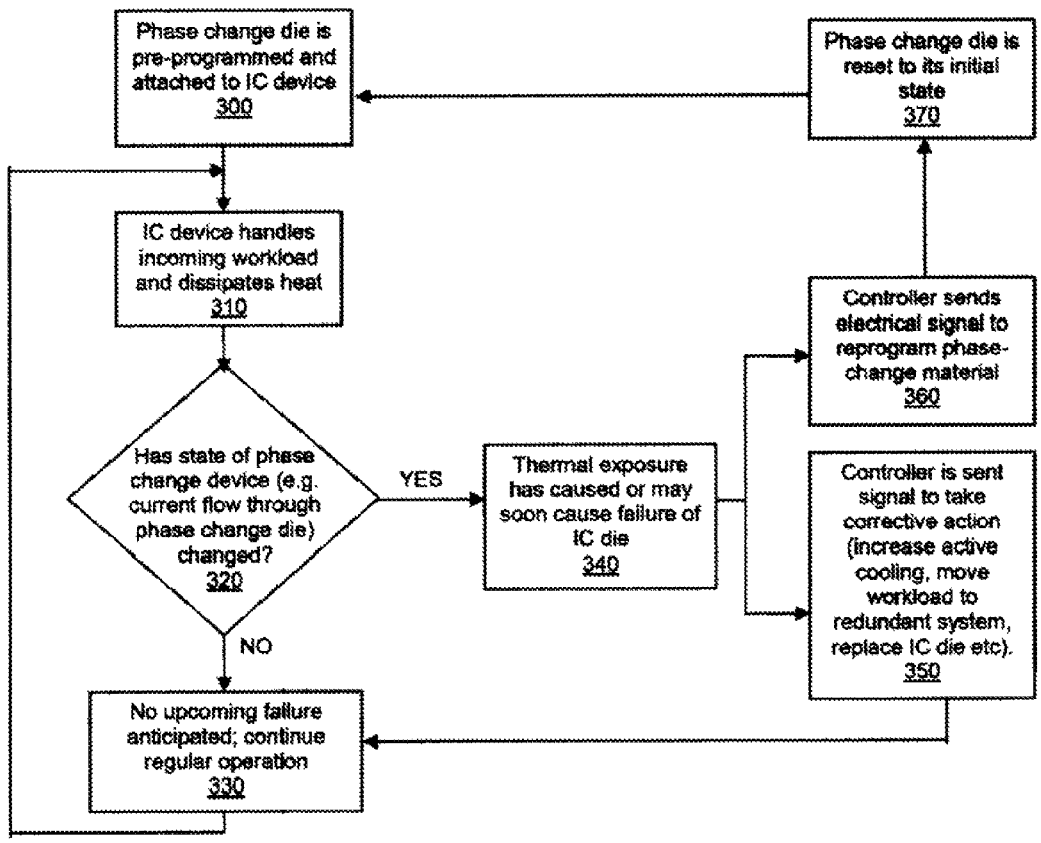
FIG. 3 is a flow diagram for managing a phase change die on a device in accordance with an exemplary embodiment.

FIG. 3 is a flow diagram for managing a phase change die on a device in accordance with an exemplary embodiment. As soon as the die experiences the threshold thermal exposure, the phase change material changes state and therefore the current through the device changes. This change of current acts as a trigger to the on-board or external controller and informs the controller that the corresponding device (for example, microprocessor, memory, or other heat generating component) has experienced significant thermal exposure. In light of such an event, the controller then takes corrective action. For example, additional cooling resources (such as those from a dynamically smart-cooled data center or a thermal inkjet spray) are diverged towards the processor. Alternatively, the controller decides to migrate workloads elsewhere to other redundant processors or systems in the data center until the impacted processor can be cooled or replaced. It should be noted that once this triggering event has been detected, the phase-change material can be electrically reset to its initial state to ensure continued reliability monitoring without requiring any downtime.

According to block 300, the phase change die is pre-programmed and attached to the IC device. In a phase change die, the size of the matrix and spacing of the bits (for example, the ones and zeros) are user selected and depend on the type of material and device (processor, memory, etc.). For instance, if a die contains millions of bits, then initially all of these bits can be programmed to ones or zeros.

According to block 310, the IC device handles incoming workloads and dissipates heat. For illustration, such devices include processing devices and memories.

According to block 320, a question is asked as to whether the state of the phase changes on the device. The state of the phase changes when one or more bits flip states (for example, change from a one to zero or from a zero to a one). When states of the bit change, an electrical resistance through the die simultaneously changes. Thus, if current flow through the die changes, then this change indicates a phase change.

Once the phase change die is mounted in its amorphous phase, a fixed voltage is maintained across the device. Unless the state of the device is changed due to thermal exposure (high temperature for short time, low temperature for long time, or high temperature for a long period of time), the electrical resistance and therefore current through the device will be constant. The current is read into an on-board or external controller, which is in turn fed to some type of response system (such as an active cooling mechanism or a workload management system).

If the answer to the question is "no" then flow proceeds to block 330. Here, no incoming device failure is anticipated. The device continues to operate in regular or normal mode and flow proceeds back to block 310.

If the answer to the question is "yes" then flow proceeds to block 340. Here, an increase in thermal temperature has caused or could soon cause failure of the IC die. In other words, an indication is provided that the device has already failed, is near failing, is likely to fail, is operating at an inefficient or unhealthy temperature, or is subject to heat beyond a threshold.

A verification can occur as to the extent of the phase change. For example, a check is made to determine a number or percentage of bits that changed from ones to zeros or from zeros to ones. By way of illustration, if all ones changed to zeros, then the entire phase change die was subject to heat beyond the threshold. By contrast, only one or more portions of the die could have been subject to heat beyond the threshold. In this instance, only a portion of the die will encounter a phase change.

Exemplary embodiments determine a location of the phase change. In other words, one portion of the die can be subject to heat beyond a threshold while another portion of the die was not subject to such heat. The portion(s) subject to such heat will exhibit a phase change (i.e., a bit transition from ones to zeros or from zeros to ones). By contrast, the portion (s) not subject to such heat will exhibit no phase change.

One exemplary embodiment uses real-time knowledge of the location of the heat increase (i.e., the location of what portion of the die was subject to heat beyond the threshold) to determine where on the die to direct cooling. For instance, if a certain location or portion of the die is exhibiting higher heat, the cooling is directed or targeted to that specific location. By way of illustration, an IC chip with multiple functionality can show increased temperature in one area while normal or acceptable temperature in another area.

According to block 350, a controller or processor is sent a signal to indicate that the thermal exposure caused a phase change at the phase change die. In response to this signal, the controller takes corrective action. Such action includes, but is not limited to, one or more of increasing active cooling, moving workload away from heated area (for example, transferring workload to a redundant system), replacing the IC die, shutting down the IC die or device, decreasing power consumption, etc.

According to block 360, the controller sends an electrical signal to reprogram the phase change material. Then, according to block 370, the phase change die or portions of the die are reset to its initial state. For example, the ones are reset back to zeros or the zeros are reset back to ones. Flow then proceeds back to block 300 to pre-preprogram the phase change device (if necessary) and then monitor the device for a phase change.

FIG. 1 illustrates an exemplary system-in-package (SiP) embodiment showing a phase change die 120 attached to an IC die 110. Variations of this embodiment include, but are not limited to, a plurality of die at the bottom, multiple layers of phase change material, different interconnections for die and phase change die, different ordering of the die, different destinations for the interconnects etc. An alternative embodiment where phase-change die is on top of an IC package (as opposed to an IC die as shown above) is illustrated in FIG. 4.

Figure 4:
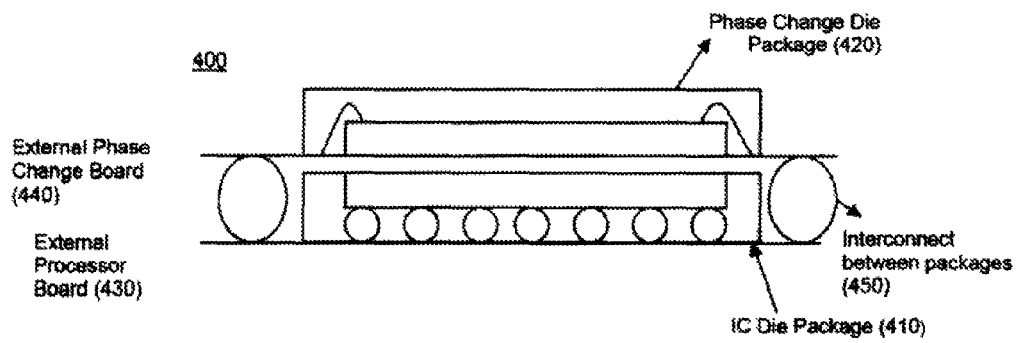
FIG. 4 is a package-on-package in accordance with an exemplary embodiment.

FIG. 4 is a package-on-package (PoP) 400 in accordance with an exemplary embodiment. By way of example, the package is flip chip which does not require bonding wires. Instead, during the final wafer processing step, solder bumps are deposited on the chip pads that connect directly to the external circuit.

The package includes an IC die package 410 and a phase change die package 420. The IC die package mounts or connects to an external processor board 430, while the phase change package mounts or connects to an external phase change board 440. Plural interconnects 440 attach to the boards 430/440 and connect the two packages together.

The variations discussed for FIG. 1 are also applicable to FIG. 4. The embodiment in FIG. 4, however, does not require pre-assembly before packaging of the IC die, since the phase-change package is added extraneously to a finished package.

In different exemplary embodiments, the phase change material can be directly mounted on the silicon die inside the package (for example, shown in FIG. 1) or it can be mounted externally as a package-on-package (PoP) configuration (for example, shown in FIG. 4). In the embodiment of FIG. 1, the phase change material is exposed to nearly the same temperatures as the die. In the embodiment of FIG. 4, the phase-change material is exposed to temperatures slightly lower than the die. With appropriate calibration of the material prior to mounting, either configuration can be utilized for exemplary embodiments.

Figure 5:
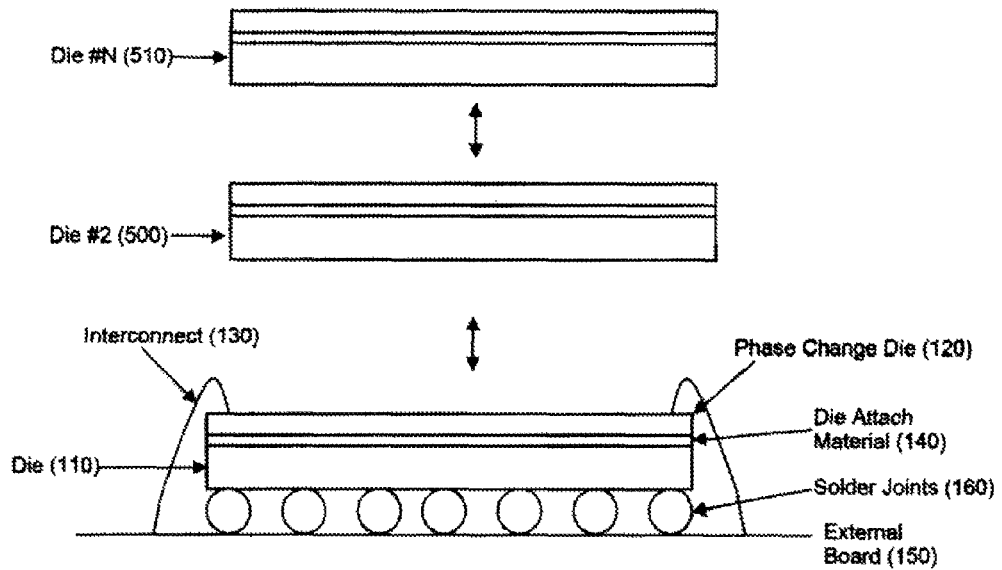
FIG. 5 is a diagram of a plurality of stacked integrated circuit dies in accordance with an exemplary embodiment.

FIG. 5 is a diagram of a plurality of stacked integrated circuit dies in accordance with an exemplary embodiment. For illustration, three die are shown being vertically stacked together. A first die 110 (for example, as discussed in connection with FIG. 1) forms a base or bottom of the stack and connects to a PCB 150. A second die 500 (die #2) stacks on top of die 110, and a third die 510 (die #N) stacks on top of die 500. Although three die are shown, exemplary embodiments include stacking two or more dies. Additionally, it is not necessary that each IC die (110, 500, 510) be attached with a phase-change die; it is possible for multiple IC die to share a single phase-change die also.

Figure 6A:
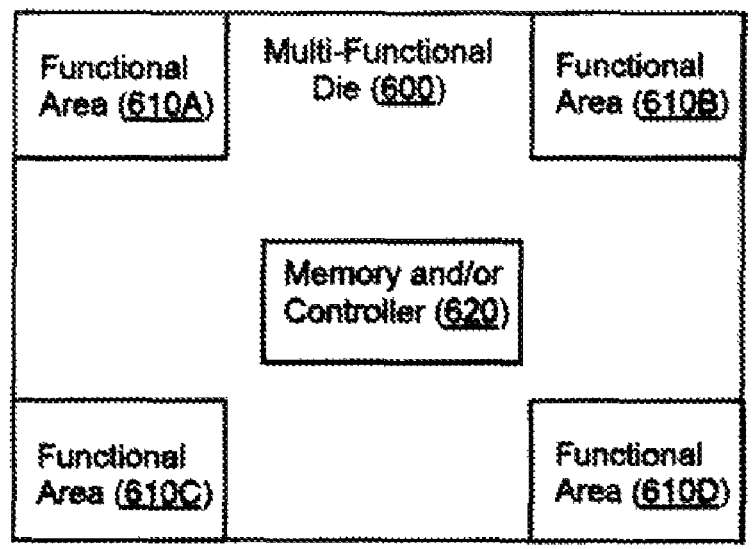
FIG. 6A is a block diagram of a single multi-functional die in accordance with an exemplary embodiment.

FIG. 6A is a block diagram of a single multi-functional die 600 in accordance with an exemplary embodiment. In one embodiment, the die includes a plurality of functional areas (shown as functional area 610A-610D) and memory and/or controller 620. In one embodiment, the memory 620 stores a thermal history for each of the functional areas over a lifetime of the die 600, and the controller functions as described in connection with FIG. 3.

Each functional area 610A-610D can perform different or same functions, such as processing, storage, etc. In one embodiment, each functional area can have different or the same phase change materials and/or different or the same matrixes and bit spacing. By way of illustration, functional area 610A can include a first type of phase change material, perform processing functionality, have a matrix with bit spacing Y, and have bits initially programmed to ones. Functional area 610B can include a second type of phase change material, perform another processing functionality (different or same as 610A), have a matrix with bit spacing X, and have bits initially programmed to zeros. Functional areas 610C and 610D can include third and fourth types of phase change material, perform other processing or storage services, and have different or similar matrixes and spacing compared to 610A and 610B.

Figure 6B:
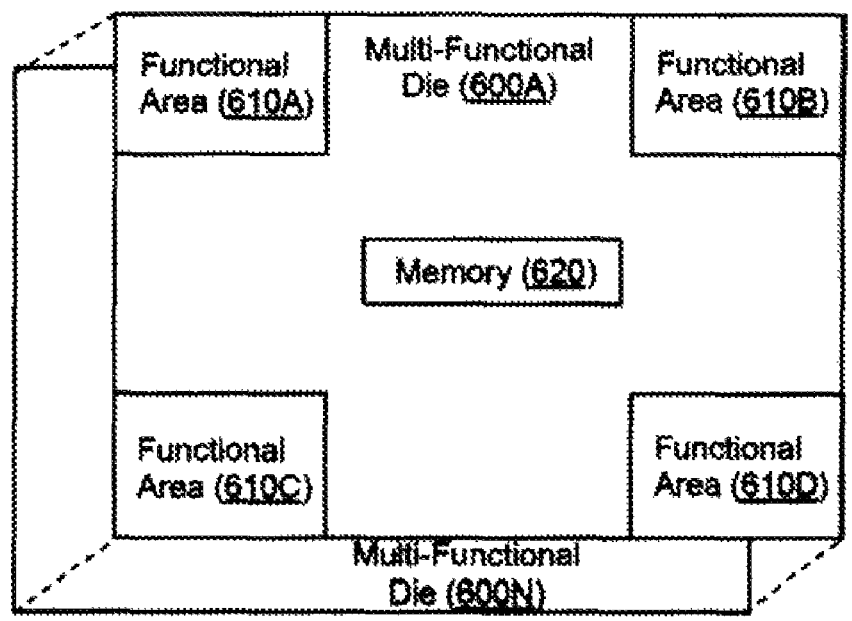
FIG. 6B is a block diagram of plural multi-functional dies stacked in accordance with an exemplary embodiment.

FIG. 6B is a block diagram of a plural multi-functional dies in accordance with an exemplary embodiment. Multiple dies (shown as 600A to 600N) are vertically stacked on each other. In one embodiment, each multi-functional die is similar to the die discussed in FIG. 6A.

Exemplary embodiments are applicable to a wide variety of systems and electronic devices. In a data center for instance, greater energy savings are attained by operating the supply air at a higher temperature. Further, an opportunity exists to directly utilize external ambient air for data center cooling in order to eliminate cooling costs associated with computer room air-conditioning units. One exemplary embodiment is used in a data center, such as with processors and memory chips in servers and storage devices. A management system establishes a damage boundary temperature for each of the electronic devices with phase change monitoring. The management system tracks the temperature at the various electronic devices and allows such devices to achieve, but not exceed, the boundary temperature (for example, a temperature at which the device runs without risk of failing due to temperature). The phase-change material properties at the electronic devices are used to physically detect the damage boundary and ensure that the devices do not exceed the pre-determined temperature.

One exemplary embodiment provides improved accuracy because the phase change die is mounted directly on the die or the package, and there is no external measurement noise. Further, an increase in system or device reliability is achieved because the decision by the controller is made via a physical event detection (i.e., phase change) rather than an interpolation of a theoretical model with built-in assumptions. Further, in one embodiment, the entire thermal history is stored in memory (as opposed to storing a single real-time temperature measurement). This thermal history, which can extend over the lifetime of the device, is used for decision-making. Further, exemplary embodiments are compatible with existing thermal solutions at the system level (for example, the system-in-package embodiment of FIG. 1 is transparent to the end user, and existing thermal solutions can be attached to the package-on-package embodiment of FIG. 4).

Additionally, if used with an active cooling solution which targets on-die hotspots (such as a thermal inkjet spray), exemplary embodiments provide exact physical locations that need to be cooled rather than guessing which locations might be hot based on thermal modeling.

Exemplary embodiments can be used with a variety of system, methods, and apparatus. By way of illustration, one exemplary embodiment mounts the phase-change package on the heat exchanger in CRAC units to sense a threshold temperature, or heat exchangers on racks, or in liquid-cooling applications to sense onset of boiling, etc. Essentially, exemplary embodiments potentially improve upon the state-of-the-art for any application requiring spatially or temporally variant thermometry, for instance at small scales. IC die are one application, since they vary significantly in small increments along both space and time, but exemplary embodiments can also be used for other devices. By way of further illustration, exemplary embodiments can be used to record thermal history of products or assemblies during a process for further qualification/testing/analysis of the process or the product.

As used herein, a "phase change" is a transformation of a thermodynamic system or material from one phase to another phase. At a phase transition, an abrupt change in one or more physical properties (such as heat capacity or electrical resistivity) occurs with a small change in a thermodynamic variable, such as temperature. The word "phase" means a set of states of a macroscopic physical system that have relatively uniform chemical composition and physical properties (such as density, electrical resistivity, crystal structure, etc.).

One or more embodiments use chalcogenide as a phase change material. As used herein, a "chalcogenide" is a chemical compound including at least one heavy chalcogen and at least one electropositive element.

As used herein, an "integrated circuit" or "chip" is an electronic circuit that includes semiconductor devices and passive components manufactured in the surface of a thin substrate of a semiconductor material. Integrated circuits and chips also include small electronic circuits constructed on individual semiconductor devices bonded to a substrate or a circuit board. Further, the terms "die" and "integrated circuit" are closely related. The die is a small block or portion of semiconductor material on which a circuit is fabricated. By way of illustration, integrated circuits are produced in batches on wafers of electronic-grade silicon (EGS) using lithography. The wafer is cut into smaller portions or pieces (known as dies) that each contain a copy of the circuit.

Exemplary embodiments discuss using a phase change die to detect an electrical resistance of a phase-change material. Exemplary embodiments, however, can detect characteristics other than resistivity (such as detecting changes in capacitance or inductance). For example, a specialized circuit is used to detect changes in capacitance or inductance of the phase-change material. As another example, the phase-change technique can be used for measuring temperature on chips with optical interconnects. This method is agnostic to the type of connections on the chip.

In one exemplary embodiment, one or more blocks or steps discussed herein are automated. In other words, apparatus, systems, and methods occur automatically. As used herein, the terms "automated" or "automatically" (and like variations thereof) mean controlled operation of an apparatus, system, and/or process using computers and/or mechanical/electrical devices without the necessity of human intervention, observation, effort and/or decision.

The methods in accordance with exemplary embodiments of the present invention are provided as examples and should not be construed to limit other embodiments within the scope of the invention. For instance, blocks in diagrams or numbers (such as (1), (2), etc.) should not be construed as steps that must proceed in a particular order. Additional blocks/steps may be added, some blocks/steps removed, or the order of the blocks/steps altered and still be within the scope of the invention. Further, methods or steps discussed within different figures can be added to or exchanged with methods of steps in other figures. Further yet, specific numerical data values (such as specific quantities, numbers, categories, etc.) or other specific information should be interpreted as illustrative for discussing exemplary embodiments. Such specific information is not provided to limit the invention.

In the various embodiments in accordance with the present invention, embodiments are implemented as a method, system, and/or apparatus. As one example, exemplary embodiments and steps associated therewith are implemented as one or more computer software programs to implement the methods described herein. The software is implemented as one or more modules (also referred to as code subroutines, or "objects" in object-oriented programming). The location of the software will differ for the various alternative embodiments. The software programming code, for example, is accessed by a processor or processors of the computer or server from long-term storage media of some type, such as a CD-ROM drive or hard drive. The software programming code is embodied or stored on any of a variety of known media for use with a data processing system or in any memory device such as semiconductor, magnetic and optical devices, including a disk, hard drive, CD-ROM, ROM, etc. The code is distributed on such media, or is distributed to users from the memory or storage of one computer system over a network of some type to other computer systems for use by users of such other systems. Alternatively, the programming code is embodied in the memory and accessed by the processor using the bus. The techniques and methods for embodying software programming code in memory, on physical media, and/or distributing software code via networks are well known and will not be further discussed herein.

The above discussion is meant to be illustrative of the principles and various embodiments of the present invention. Numerous variations and modifications will become apparent to those skilled in the art once the above disclosure is fully appreciated. It is intended that the following claims be interpreted to embrace all such variations and modifications.

What is claimed is:

1. A method, comprising:
   detecting when a state of a phase change die changes due to a temperature of an integrated circuit die exceeding a threshold;
   sending a signal to a controller to take corrective action in response to the temperature of the integrated circuit die.

2. The method of claim 1 further comprising, reprogramming the phase change die to reset bits back to an initial state before the temperature of the integrated circuit die exceeded the threshold.

3. The method of claim 1 further comprising, increasing cooling to reduce the temperature of the integrated circuit die upon detecting that the temperature exceeds the threshold.

4. The method of claim 1 further comprising, wherein the corrective action includes shifting workload away from the integrated circuit die, increasing cooling to the integrated circuit die, and relocating power consumption at the integrated circuit die.

5. The method of claim 1 further comprising:
   detecting a specific area of the integrated circuit die where temperature exceeded the threshold and where temperature did not exceed the threshold;
   providing a targeted cooling to the specific area where the temperature exceeded the threshold.

6. The method of claim 1 further comprising, stacking a plurality of integrated circuit dies into a package, wherein one or more of the integrated circuit dies includes a phase change material to detect when a phase change material changes phases.

7. The method of claim 1 further comprising:
   detecting when a first functional area of the integrated circuit die experiences a phase change to indicate excessive exposure to heat;
   detecting when a second functional area of the integrated circuit die experiences a phase change to indicate excessive exposure to heat, wherein the first and second functional areas perform different processing functions.

* * * * *